United States Patent [19]

Jones et al.

[11] 3,967,987

[45] July 6, 1976

[54] EPITAZY OF HETEROJUNCTION DEVICES

[75] Inventors: Addison Brooke Jones, LaMirada; Herbert F. Matare, Los Angeles, both of Calif.

[73] Assignee: Globe-Union Inc., Milwaukee, Wis.

[22] Filed: Mar. 15, 1972

(Under Rule 47)

[21] Appl. No.: 234,770

[52] U.S. Cl.............................. 148/171; 148/172; 148/1.5; 148/33; 29/576 E; 252/62.3 GA
[51] Int. Cl.² ........................................ H01L 7/38
[58] Field of Search................ 148/171, 172, 1.5; 29/576; 252/62.3 GA; 117/201

[56] References Cited
UNITED STATES PATENTS

| | | | |
|---|---|---|---|
| 2,813,048 | 11/1957 | Pfann........................... | 75/65 ZM |
| 3,537,029 | 10/1970 | Kressel et al. ................. | 148/171 X |
| 3,600,240 | 8/1971 | Rupprecht et al................ | 148/171 |
| 3,694,275 | 9/1972 | Nelson.......................... | 148/171 |

Primary Examiner—G. T. Ozaki
Attorney, Agent, or Firm—James L. Kirschnik; John P. Ryan

[57] ABSTRACT

A method of producing light emitting diodes of high quantum efficiency in mass production by utilizing an epitaxial deposition from a small size melt such that the substrate itself serves as a saturation source. A silicon doped gallium arsenide wafer is cleaned and etched by normal means and subsequently the wafer is precoated with a properly doped gallium master melt. The coated wafers are inserted into an epitaxial furnace and the gallium master melt effects solution of a portion of the gallium arsenide monocrystal substrate and finally the entire wafer is cooled, maintaining a temperature gradient causing epitaxial growth on the substrate.

9 Claims, 2 Drawing Figures

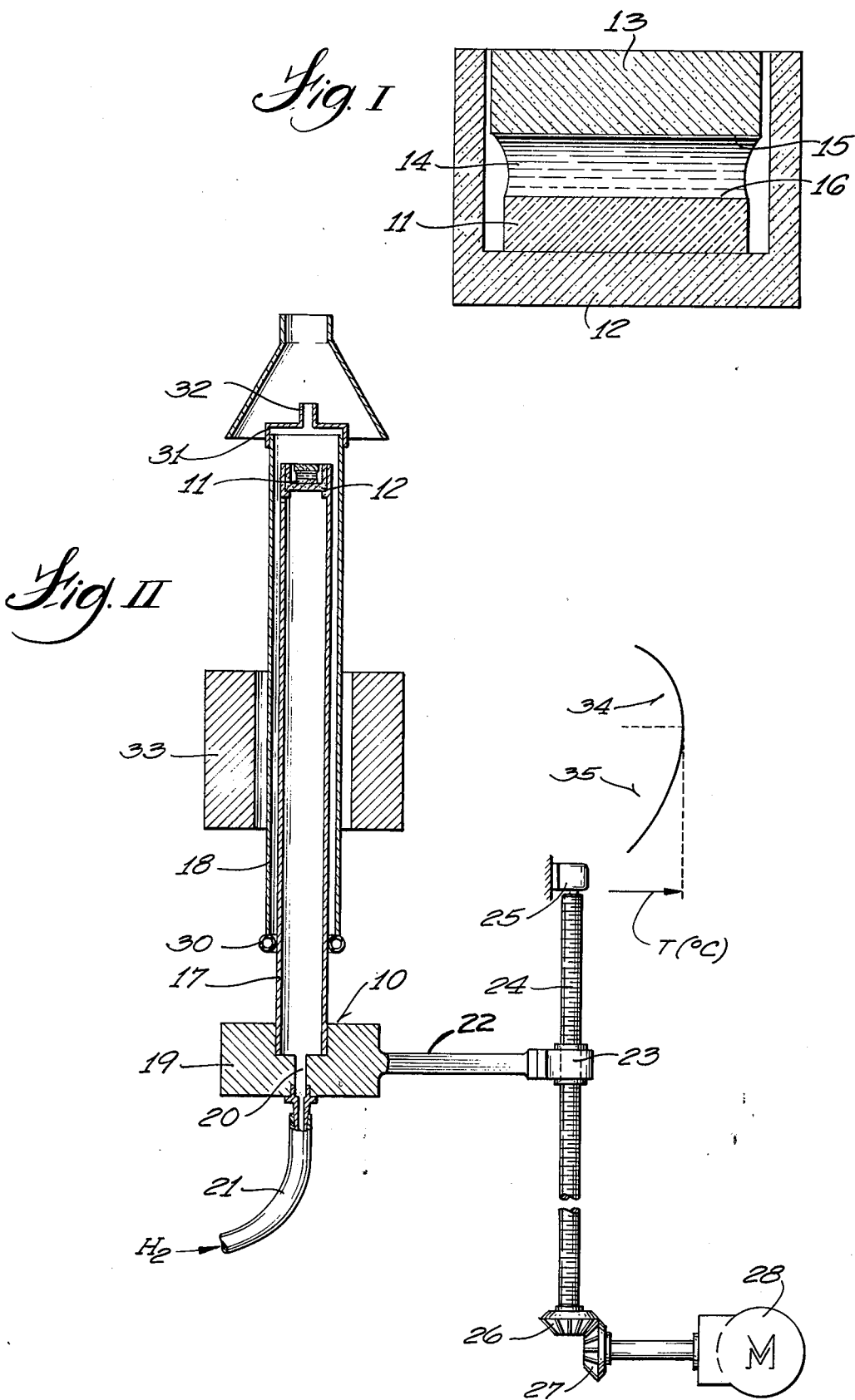

EPITAZY OF HETEROJUNCTION DEVICES

BACKGROUND OF THE INVENTION

This invention relates to the epitaxial growth of crystals for the production of light emitting devices and more particularly to a process for obtaining epitaxial growth wherein a basic gallium arsenide wafer is precoated with a gallium master melt. It is then heated to effect solution of a portion of the substrate, and the entire wafer is then cooled in a manner so that it remains slightly cooler than the melt during the cooling cycle, resulting in a high quality epitaxial layer grown on the substrate.

The method first utilized in producing devices of the type concerned with in this invention is described in U.S. Pat. No. 3,158,512 wherein a flooding or dipping method is utilized for introducing an epitaxial layer on a semiconductive wafer. A method involving the liquid phase epitaxy of semiconductor material in a sandwich structure employing a temperature gradient is described in U.S. Pat. No. 3,301,716. Recently, the flooding procedure has been implemented by the procedures indicated in U.S. Pat. Nos. 3,551,219 and No. 3,560,276 wherein the surface conditions of the seed wafer are improved by use of a sliding crucible, open on both sides. The crucible is machined into a graphite block which slides over the wafer sitting in a groove of the graphite rail. These so-called conventional dipping or tipping techniques are said to be improved upon in an article entitled "The Liquid Phase Epitaxy of Aluminum Gallium Arsenide for Monolithic Planar Structures" appearing in Volume 59 No. 10 of the Proceedings of the I.E.E.E. October 1971 by Joseph M. Blum and Kwang K. Shih wherein a liquid phase epitaxial process is described for a melt containing gallium, gallium arsenide, aluminum, and a dopant which is laid above the source material inside a sliding graphite top plate.

In the previously referred to processes the surface melting conditions and temperature controls place narrow boundary limits on the success rate. In some instances, the vibration of the melt has been used to homogenize the oversaturated solution and to improve the cooling conditions. While these methods can be used for laboratory work, mass production of light emitting devices has to be based on a more reliable method of production which at the same time will have the advantage of easier handling such that less technically trained personnel can successfully achieve high quality epilayers.

It is an object of the present invention to provide a novel process for producing epitaxial depositions on a substrate in a fast and reliable manner. It is another object of this invention to provide a process for producing heteroepitaxial layers in mass production such that the substrate crystal itself serves as a saturation source. It is still another object of the present invention to provide a method for producing light emitting diodes by the epitaxial growth process wherein the epilayers are of high quality and have close tolerances yet can be performed by personnel who are not highly trained. It is yet another object of this invention to provide a unique ohmic contact which is formed during eutectic bonding of the alloy die.

SUMMARY OF THE INVENTION

The foregoing objects are accomplished and the shortcomings of the prior art are overcome by the present process wherein the gallium arsenide wafer is precoated with a gallium master melt. The coated wafer is inserted into an epitaxial furnace and upon heating, the gallium master melt effects dissolution of a portion of the gallium arsenide monocrystal substrate. The entire wafer is subsequently cooled by controlling the temperature gradient so that the melt remains at a slightly higher temperature than the substrate. Further, gold-germanium is used in conjunction with the epitaxially layered substrate as an ohmic contact which is formed during the eutectic bonding of the die.

BRIEF DESCRIPTION OF DRAWINGS

A better understanding of the present process will be accomplished by reference to the drawing wherein:

FIG. I is a view in vertical section of a graphite disk, melt, and substrate in a graphite crucible ready for growth of the epitaxial layer.

FIG. II is a diagrammatic view of the preferred epitaxial furnace and the associated transport mechanism utilized in carrying out the process of this invention including a graphic representation of the temperature profile of the furnace.

The following Examples are intended for the purpose of illustrating the present invention. They should not be construed as limiting the invention to the precise ingredients, amounts, or conditions specified.

DESCRIPTION OF THE PREFERRED EMBODIMENT

EXAMPLE I

A gallium master melt is prepared by combining 50 grams of gallium, 1 gram of zinc and 0.1 gram of aluminum in a vitreous carbon crucible and alloying these materials at 800°C. for 15 minutes in a hydrogen atmosphere. This melt is suitable for preparation of top-emitting gallium aluminum arsenide-gallium arsenide 9100A light emitting diodes.

A polished silicon-doped gallium arsenide wafer is subjected to a brief clean-up etch in any of the polishing etch solutions familiar to those skilled in the art. A drop of the gallium master melt (approximately 1 gm) is then placed on the polished surface of a wafer with about 2 – 4 square centimeters area. The polished wafer is then wetted by brushing the melt with a natural bristle brush lightly over the wafer. Sufficient melt is then added to provide a slightly rounded, continuous coverage. Referring to FIG. I, the wafer 11 is then placed in a graphite crucible 12 with a graphite disk 13 in contact with the melt 14.

The crucible 12 with the wafer 11 is then placed on a transport mechanism generally 10, shown in FIG. II. This mechanism is composed of a quartz tube 17 which is movably and axially positioned in a fixed quartz tube 18 with the movable quartz tube 17 engaged by a graphite holder 19 through which is disposed a hydrogen inlet channel 20 in communication with a hydrogen inlet tube 21. Graphite holder 19 axially moves quartz tube 17 through tube 18 by a connecting shaft 22 to secure it to collar 23 which is threadably engaged on shaft 24 and pivotally anchored by block 25 at one end. Rotation is effected by bevel gears 26 and 27 and motor 28.

The fixed quartz tube 18 is supplied with a Teflon seal 30 which allows vertical motion of the movable quartz tube 17, but forms a gas seal for the system. It is closed at the opposite end by a header 31 with a hydrogen outlet tube 32. An oven 33 is laterally positioned around the fixed quartz tube 18 and comprises the epitaxial furnace.

The quartz tubes 17 and 18 are purged with hydrogen and a hydrogen atmosphere is provided and maintained during growth. The transport mechanism carries the wafer 11 and the melt 14 through the furnace 33 and tube 18 at a speed to provide a cooling rate of about 1 degree per minute while the growth of the epitaxial layer is occurring. The melt 14 first dissolves gallium arsenide on the wafer during the heating portion of the furnace temperature profile 34 and then deposits the zinc doped gallium aluminum arsenide during the cooling portion 35. The slope of the cooling profile produces the required temperature gradient with the substrate slightly cooler than the melt. The peak temperature is typically about 900°C. and the growth period of about 70 minutes regularly produces gallium aluminum arsenide epitaxial layers approximately 0.002 inches thick. A PN junction is formed in the substrate several microns below the epitaxial layer, by the diffusion of zinc during growth. After cooling to room temperature, the excess melt is removed and the wafer is cleaned. The nearly identical thickness of the starting substrate and the final epitaxial structure indicates that nearly all of the arsenic released from the gallium arsenide substrate during meltback is subsequently incorporated into the epitaxial layer.

EXAMPLE II

A contact layer consisting of 5000 A gold followed by 5000 A germanium is then vacuum deposited by standard evaporation on the substrate side of the wafer which is held at 300°C. during deposition, after heat cleaning in vacuum ($10^{-6}$ Torr) at 350°C. The wafer is then scribed and broken using standard techniques into a 0.015 inch square diode chips.

The gold-germanium contact of the die is then eutectically bonded to a gold plated metallic header held at 450°C. by a scrubbing action. This forms the cathode contact. A thermocompression or ultrasonic wire bond is then made to the top (anode) contact. The mounted device is then encapsulated using standard techniques.

It will be noted that the use of the gold-germanium contact performs two functions, namely, as an ohmic contact and as an eutectic alloy for die bonding. Previously, gold-germanium has been used as an ohmic contact and has also been employed with silicon devices as an eutectic bonding preform. However, in this application, it fulfills both functions without the need for handling a special preform, as the ohmic contact is formed during eutectic bonding of the die.

In the previous Examples, a melt consisting of an alloy of gallium, aluminum and zinc is applied to the wafer composed of silicon-doped gallium arsenide to produce a zinc-doped gallium aluminum arsenide epitaxial layer. However, the process of this invention can be utilized in growing other epitaxial layers such as gallium arsenide antimonide and gallium indium arsenide as well as other alloys in Groups III and V of the Periodic Table of Elements. The substrates utilized may be III-V monocrystals other than silicon-doped gallium arsenide as well. The process is useful in the growth of any compound which is suitable for growth by liquid phase epitaxy. A cooling rate of 1 degree centigrade per minute is preferred in the process of this invention. This can range from 10° to 0.1°C. per minute with varying degrees of success. The temperature during epitaxial growth can range from 650°C. to 1100°C. and deposition times can vary from 10 to 300 minutes. This variation in process has resulted in epitaxial layers which vary in thickness from several microns to 0.004 inches.

An important aspect of the present process is maintenance of the proper temperature gradient during growth such that the temperature of the melt as indicated in FIG. I by 15 is higher than at 16. This gradient is accomplished by the furnace profile, and promotes nucleation and growth on the substrate surface. The pre-wetting of the substrate and use of the graphite disk on top of the melt result in a flat interface between substrate and epilayer, and uniform thickness of epilayer.

A wire-wound furnace or oven, 33, FIG. II, as used for accomplishing initial partial dissolution of the wafer and providing the proper temperature gradient is shown in FIG. II. If desired, an RF type heating coil with a graphite susceptor could be utilized but this requires careful adjustment of the system configuration and close control of power to maintain even cooling and the proper temperature gradient.

It will thus be seen that through the present invention there is now provided a process for epitaxial growth on a substrate which is simplified in its use yet is highly reliable. The methods lends itself to mass production in that it does not require great care or handling yet can be operated by a person who is not highly technically trained. Further, the process can be carried out by apparatus currently on the market and the process lends itself to being semiautomated.

Concerning the use of the gold-germanium contact, this particular aspect is very advantageous in that the contact performs the dual function of an ohmic contact and a eutectic alloy for die bonding without the need for handling a special preform.

The foregoing invention can now be practiced by those skilled in the art. Such skilled persons will know that the invention is not necessarily restricted to the particular embodiments presented herein. The scope of the invention is to be defined by the terms of the following claims as given meaning by the preceding description.

We claim:
1. A method of producing an epitaxial layer on a crystalline semiconductor substrate comprising precoating the semiconductor substrate with a portion of a master melt, depositing a selected quantity of the master melt, heating the deposited master melt and the semiconductor substrate to melt a portion of the substrate and controlling the cooling of the substrate and the master melt so that a high-quality epitaxial layer is grown on the substrate.

2. The method as defined in claim 1 wherein the master melt is an alloy, designed to produce a doped ternary compound semiconductor layer.

3. The method as defined in claim 2 wherein the ternary compound is gallium aluminum arsenide.

4. The method as defined in claim 1 wherein the substrate is gallium arsenide doped with silicon.

5. The method as defined in claim 1 wherein said heating is effected by moving said semiconductor substrate with said master melt through a furnace.

6. A method as defined in claim 1 wherein said semiconductor substrate while coated with said melt covered with a graphite disk is heated in a graphite crucible.

7. The method as defined in claim 1 wherein said semiconductor substrate is in the form of a wafer.

8. The method as defined in claim 1 wherein a gold-germanium contact serves as both an ohmic contact and an eutectic alloy for bonding the device to a metallic surface.

9. The method as defined in claim 1 wherein one or more constituents of the epitaxial layer are derived solely from the substrate.

* * * * *